United States Patent [19]

Corey et al.

[11] Patent Number: 5,370,225
[45] Date of Patent: Dec. 6, 1994

[54] TRAY ARRANGEMENT FOR MULTIPLE LEAD INTEGRATED CIRCUIT COMPONENTS AND THE LIKE

[75] Inventors: Ronald J. Corey, Morristown; Robert G. Antonelli, Matawan, both of N.J.

[73] Assignee: Fancourt Industries, Inc., West Caldwell, N.J.

[21] Appl. No.: 112,947

[22] Filed: Aug. 30, 1993

[51] Int. Cl.[5] ............................................. B65D 73/02
[52] U.S. Cl. .................................. 206/328; 206/234; 206/483
[58] Field of Search ............... 206/328, 334, 329, 488, 206/483, 486, 477

[56] References Cited

U.S. PATENT DOCUMENTS

| | | | |
|---|---|---|---|
| 3,772,573 | 11/1973 | Triplett et al. | 206/328 |
| 3,826,377 | 7/1974 | Bachmann | 206/328 |
| 4,483,442 | 11/1984 | Worth | 206/334 |
| 5,012,925 | 5/1991 | Gallagher, Sr. | 206/334 |
| 5,305,879 | 4/1994 | Noschese | 206/328 |

*Primary Examiner*—Paul T. Sewell
*Assistant Examiner*—Thomas P. Hilliard
*Attorney, Agent, or Firm*—Anthony F. Cuoco

[57] ABSTRACT

A tray includes adjustably positioned support members for supporting multiple lead integrated circuit components of various sizes and configurations. The components are supported by the support members so that the component leads do not make contact with said support members. A cover is disposed on the tray to protect the components when storing and/or transporting same. The cover is arranged to receive another tray whereby a stackable arrangement of covered trays is provided. The stackable arrangement may be strapped for providing a storable/transportable package of microelectronic components.

18 Claims, 2 Drawing Sheets

TRAY ARRANGEMENT FOR MULTIPLE LEAD INTEGRATED CIRCUIT COMPONENTS AND THE LIKE

BACKGROUND OF THE INVENTION

This invention relates to trays for storing and/or transporting multiple lead integrated circuit components and like microelectric components while preventing damage to said components as might otherwise occur.

Multiple lead integrated circuit components, i.e. chips, may be of various sizes and configurations. Indeed, a particular electronic module may include a plurality of such components of different sizes and configurations which must be stored and/or transported in kit form for assembly or for module replacement purposes. Likewise, it may be necessary to store and/or transport a plurality of components of various sizes and configuration for maintenance or repair purposes as is likely to occur from time to time. Accordingly, a tray for the purposes described is advantageously directed to both situations. Also, advantageously, a plurality of such trays should be stackable for effective utilization.

The applicants herein are aware of the following prior art relating to their invention: U.S. Pat. No. 3,719,272 (U.S. Class 206/65F) issued to Bodine, et al on Mar. 6, 1973; U.S. Pat. No. 4,671,407 (U.S. Class 206/332) issued to Brutosky on Jun. 9, 1987; U.S. Pat. No. 5,103,976 (U.S. Class 206/328) issued to Murphy on Apr. 14, 1992; U.S. Pat. No. 5,203,454 (U.S. Class 206/328) issued to Strong on Apr. 20, 1993; and U.S. Pat. No. 4,856,455 (U.S. Class 118/500) issued to Tee on Aug. 15, 1989.

U.S. Pat. No. 3,719,272 features an interlocking case for electric components having an inverted cup-shaped member and a plurality of circumferentially spaced tabs projecting from the top of the cup-shaped member. An open top cup-shaped member has a plurality of circumferentially spaced tabs projecting inwardly from its side wall below the bottom of said member. The inverted cup-shaped member is seated in the open top member with said members having registering openings in their side walls for passage of wiring from the inverted cup-shaped member, and means on their proximate side wall surfaces for preventing rotation of the two members relative to each other. The tabs on the top of one case engage the tabs on the bottom of another case for stacking a plurality of cases.

U.S. Pat. No. 4,671,407 relates to a package for carrying card edge electrical connectors and the like for use with automatic storage and retrieval systems and with robotic equipped insertion tools. The package includes support means for supporting connectors and spaces between the support means for receiving pins depending from the connectors.

U.S. Pat. No. 5,103,976 relates to a tray for storing and transporting multiple pin grid array integrated circuit components. The tray features a lattice framework that defines discrete storage pocket areas, each of which comprises a base support that spans portions of the framework and includes upstanding ribs that engage the integrated circuit components. The upstanding ribs are located so that a given set constitutes a rectangle or square that is concentric with and spaced from the other sets of upstanding ribs. Depending terminal pins lie between individual ones of the upstanding ribs. Trays of this configuration can be arranged in stackable relation.

U.S. Pat. No. 5,203,454 relates to packaging sensitive electronic components and features a tray having an outer wall with an inside surface partially defining a protected space. Releasable retention bars retain the electronic components in the protected space. The tray and retention bars are preferably fabricated from an electrically conductive material for grounding during transport and handling.

U.S. Pat. No. 4,856,455 relates to a carrier for dual-in-line packages to be wave soldered and comprises a frame with tracks into which the packages can be slid. The tracks are defined by a line of upper and lower channel members providing rails. Each track is defined between adjacent pairs of upper and lower members. Gates at either end of the tracks control movement of the packages into or out of the carrier.

The present invention features a tray including at least a pair of tracks. The tracks carry a plurality of adjustably positioned members which are configured to support discretely shaped multiple lead integrated circuit and like microelectric components. Accordingly, the present invention is seen to distinguish over the aforementioned prior art, as will hereinafter become more evident.

SUMMARY OF THE INVENTION

This invention contemplates a tray for multiple lead integrated circuit components and the like and a cover for the tray. The cover is arranged to receive in stackable fashion another tray with another cover. A plurality of trays and covers may be so stacked. Straps or the like may be disposed around the stacked arrangement for securing the several trays and covers as a transportable package.

The tray includes at least a pair of tracks. The tracks carry a plurality of adjustably positioned support members which are configured to support discretely shaped circuit components of the type described. The support members are positioned along the tracks to accommodate various sizes of circuit components and are of various configurations to accommodate circuit components of likewise various configurations. The circuit components are supported whereby the leads thereof overhang the support members so as not to make contact therewith.

With the arrangement described, the microelectric components are supported for storage and/or transportation purposes without being damaged, as might otherwise occur.

DETAILED DESCRIPTION OF THE INVENTION

Figure 1:
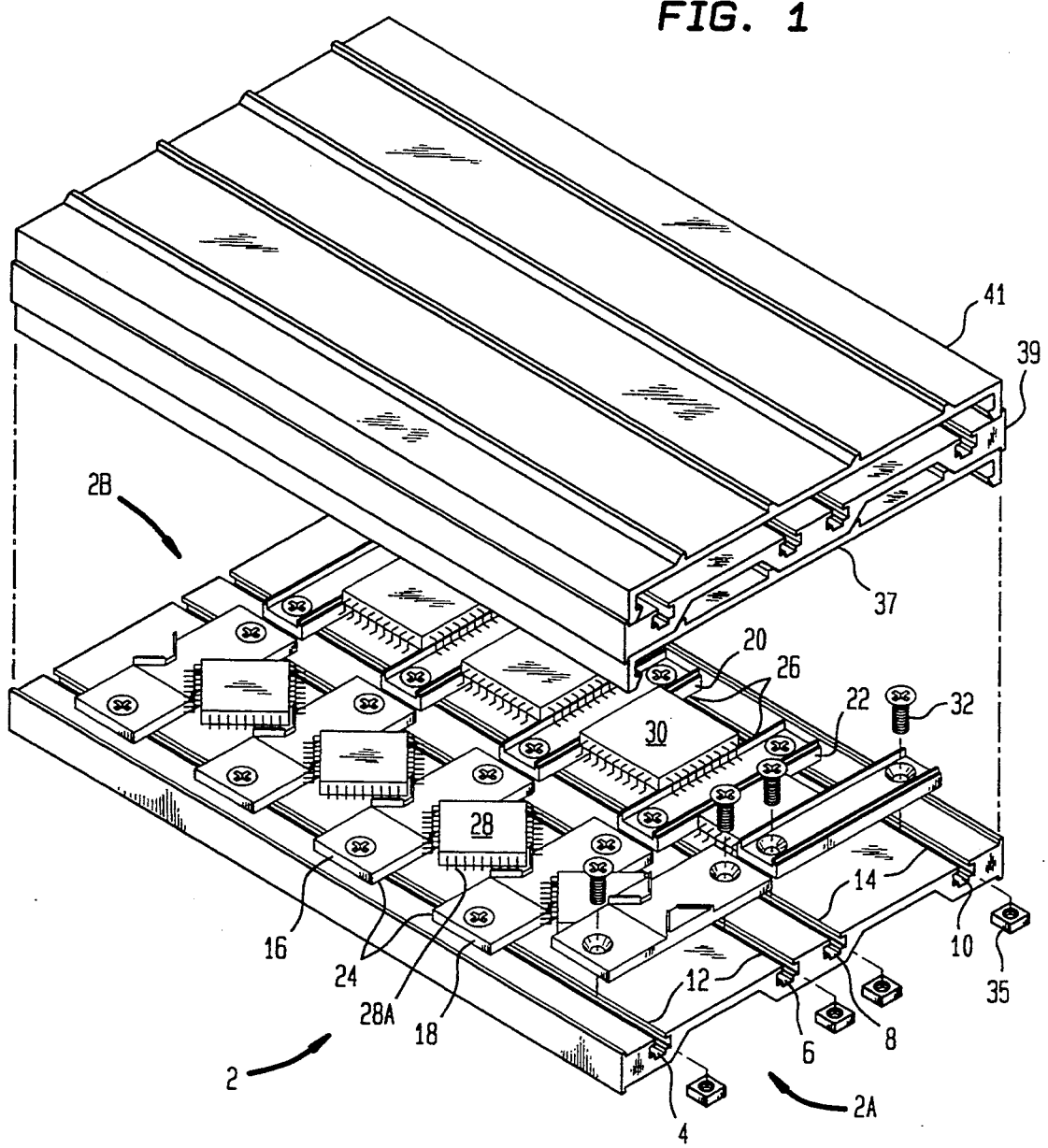
FIG. 1 is a perspective view illustrating a tray and cover arrangement for multiple lead integrated circuit components and the like according to the invention.

With reference first to FIG. 1, a tray in accordance with the invention is designated by the numeral 2. Tray 2 includes a plurality of tracks shown, for purposes of illustration, as four in number and designated by the numerals 4, 6, 8 and 10. Tracks 4, 6, 8 and 10 extend in longitudinal parallel spaced relation from one end 2A of tray 2 to the opposite end 2B thereof. The spaced relation between tracks 4 and 6 is such so as to form a track pair 12 and the spaced relation between tracks 8 and 10 is such so as to form a track pair 14. It will be understood that although four tracks and two track pairs are shown for purposes of illustration, it is within the scope of the invention to provide two tracks and a single track pair as well as a plurality of tracks and a plurality of track pairs, as will now be appreciated.

Track pair 12 including tracks 4 and 6 supports a plurality of support members such as 16 and 18 and track pair 14 including track pairs 8 and 10 supports a plurality of support members such as 20 and 22. The arrangement is such that support members 16 and 18 and 20 and 22 are longitudinally displaceable along tracks 4 and 6 of track pair 12 and tracks 8 and 10 of track pair 14, respectively. Thus, support members such as 16 and 18 are discretely spaced along tracks 4 and 6 to form a support member pair 24 and support members such as 20 and 22 are discretely spaced along tracks 8 and 10 to form a support member pair 26. In this regard, it will be understood that the support members in each support member pair may be common to the next preceding or succeeding support member pair as the case may be. In this manner, longitudinal rows of like support member pairs can be provided to serve the purposes of the invention as may be desireable and as will be readily discerned from FIG. 1.

Each of the support member pairs such as 24 and 26 are configured to support multiple lead integrated circuit components and the like, hereinafter referred to as chips, and designated by the numerals 28 and 30, respectively. Chips 28 and 30 are of different sizes and/or configurations as illustrated in FIG. 1. In this regard, it will now be appreciated that although all of the support members supported by track pair 12 are illustrated as being alike such as 16 and 18, and all of the support members supported by track pair 14 are illustrated as being alike such as 20 and 22, differently configured support members may be interchanged in pairs to add to the versatility of the invention.

The discrete spacing between support members such as 16 and 18 and 20 and 22 is accomplished via screws such as 32 which extend through the support members and into the respective track so as to be secured thereon via nuts or the like 35 disposed in the track. With the arrangement described, not only the positioning of the support member pairs along the respective tracks is accomplished, but the spacing between the support members is adjustable so as to accommodate chips such as 28 and 30, which are of different sizes. Further, the support members are thus removably supported on the tracks for achieving the aforementioned interchangeability.

Figure 3:
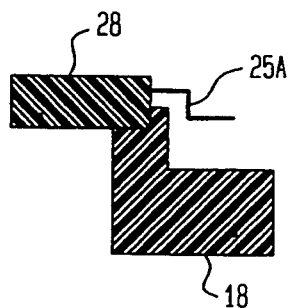
FIG. 3 is a sectioned diagrammatic end view representation particularly illustrating how multiple lead integrated circuit components are supported in the tray by support members.

An important feature of the invention is how chips such as, for example 28, are supported in support members such as, for example 18, and in this regard reference is made to FIG. 3. Thus, the chip is supported by the support member, irrespective of the configuration of the chip and support member so that the chip leads 28A overhang the support member and are not in contact therewith, as will be recognized as desireable to best protect said leads.

It will be understood that several support member configurations may be used with the invention such as, for example, the configuration of support members 16 and 18 and the configuration of support members 20 and 22. While each of the support members 16, 18, 20 and 22 support the bottom of the respective chips such as 28 and 30, support members 16 and 18 support the opposite corners of chips 28 while support members 20 and 22 support the opposite sides of chips 30.

An important feature of the invention is that tray 2 is covered for the purposes described and in this regard, a cover 37 is illustrated in FIG. 1. Further, additional trays and covers such as 39 and 41, respectively, may be stacked to facilitate bulk storing and/or transporting of chips such as 28 and 30 in a multiple tray package as best illustrated in FIG. 2.

Figure 2:
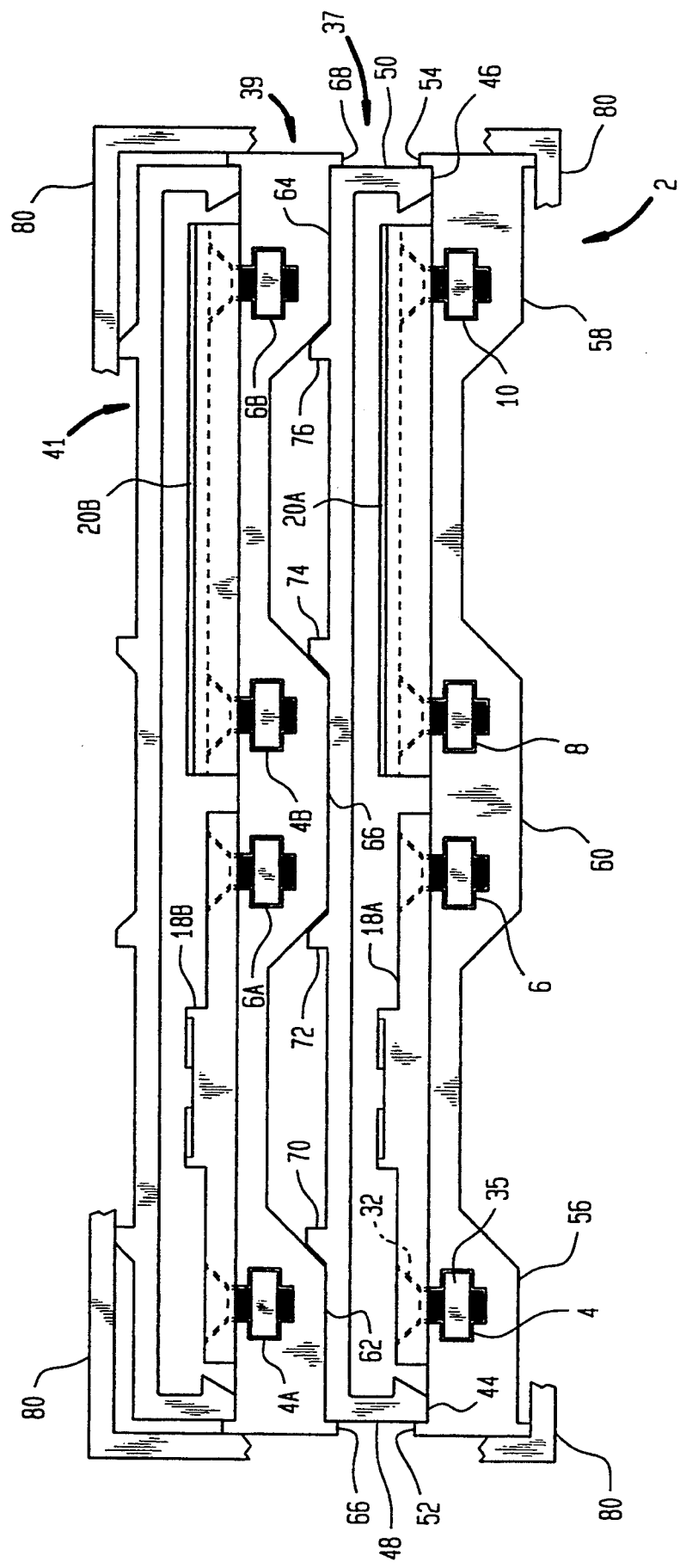
FIG. 2 is an end elevational view best illustrating a stacked tray and cover arrangement.

Thus, with reference to FIG. 2, wherein elements corresponding to those in FIG. 1 carry corresponding numerical designations, tray 2 has support members 18A and 20A adjustably and removably secured in tracks 4 and 6 and in tracks 8 and 10, respectively, in a manner as has heretofore been described. Cover 37 is disposed over tray 2. Tray 39 is disposed on cover 37 and cover 41 is disposed over tray 39 to form a stacked arrangement. Tray 39 has support members 18B and 20B adjustably secured in tracks 4A, 4B and in tracks 6A, 6B, respectively, in a manner as has heretofore been described. The particular configuration of the indicated trays and covers to achieve a desired stacked arrangement will next be described.

With continued reference to FIG. 2, the trays such as 2 and 39 include parallel longitudinally extending opposite side planar surfaces 44 and 46 on the upper surface thereof. Planar surfaces 44 and 46 support parallel longitudinally extending legs 48 and 50, respectively, of the covers such as 37. Lateral movement of legs 48 and 50 is prevented by parallel longitudinally extending lips 52 and 54 extending upwardly from planar surfaces 44 and 46, respectively. Each of the trays has parallel longitudinally extending side surfaces such as 56 and 58 and a substantially centrally disposed longitudinally surface 60 extending parallel to side surfaces 56 and 58 shown on tray 2. Surfaces such as 56, 58 and 60 are supported on parallel longitudinally extending side planar surfaces 62 and 64 and a centrally disposed longitudinal planar surface 66 extending parallel to side surfaces 62 and 64 shown on a cover such as 37. Lateral movement of the covers on the trays is prevented by parallel longitudinally extending lips 66 and 68 extending downwardly from surfaces 62 and 64, respectively, and longitudinally extending lips 70, 72, 74 and 76 extending upwardly therefrom. With the arrangement described, it will be discerned that the several covers are nested in the several trays and the trays are nested in the covers to serve the purposes of the invention.

In order to provide a transportable and/or storable package, the several stacked trays and covers as illustrated in FIG. 2 are strapped together such as by a strap 80 extending transversely around the tray/cover package with the ends of the strap secured each to the other such as by loop and pile members. Several such straps may be disposed longitudinally along the package, as will also now be understood.

In accordance with the aforegoing, it will be appreciated that a tray for multiple lead integrated circuit components and the like has been disclosed. The tray includes a cover which nests in the tray and is arranged so that another tray nests in another cover. A plurality of trays and covers may be so arranged to provide a stacked arrangement. Straps or the like may be disposed around the stacked arrangement for securing the several trays and covers together in a storable/transportable package.

A particular feature of the invention is that support members for the integrated circuit components are adjustable and interchangeable to support components of various sizes and configurations. With the arrangement described, the components are supported for storage and/or transportation purposes without being damaged, as might otherwise occur.

In fabricating the invention, trays such as 2 and covers such as 37 may be, for example, of a metallic material suitable for the purposes of the invention and support members such as 16 and 18 may be, for example, of a plastic material, likewise suitable for the purposes of the invention.

With the above description of the invention in mind, reference is made to the claims appended hereto for a definition of the scope of the invention.

What is claimed is:

1. A tray arrangement for multiple lead circuit components, comprising:
   a tray including at least a pair of parallel, longitudinally extending tracks;
   a plurality of circuit component support members each being of like configuration, said support members arranged in pairs and mounted on the pair of tracks so as to be longitudinally displaceable therealong;
   each of the support members in a pair being longitudinally displaced along the pair of tracks relative to the other support member in the pair to provide a discrete spaced relation between the support members in the pair;
   a cover supported by the tray;
   the tray and the cover each have a top and a bottom;
   the tray top and the cover bottom are arranged so that the cover bottom nests in the tray top above circuit components supported by the support members; and
   the cover top is arranged so that the bottom of an other tray nests in the top of the cover, whereby a plurality of trays and covers are arranged in stacked fashion.

2. A tray arrangement for multiple lead circuit components, comprising:
   a tray including at least a pair of parallel, longitudinally extending tracks;
   a plurality of circuit component support members being of the same and different configurations;
   said plurality of support members arranged in pairs of said members of the same configuration and mounted on the pair of tracks so as to be longitudinally displaceable therealong;
   each of the support members in a pair being longitudinally displaced along the pair of tracks relative to the other support member in the pair to provide a discrete spaced relation between the support members in the pair;
   a cover supported by the tray;
   the tray and the cover each have a tog and a bottom;
   the tray top and the cover bottom are arranged so that the cover bottom nests in the tray top above circuit components supported by the support members; and
   the cover top is arranged so that the bottom of an other tray nests in the top of the cover, whereby a plurality of trays and covers are arranged in stacked fashion.

3. A tray arrangement for multiple lead circuit components, comprising:
   a tray including a plurality of pairs of parallel, longitudinally extending tracks;
   a plurality of circuit component support members being of the same and different configurations;
   said plurality of support members arranged in pairs of said members of the same configuration and mounted on the plurality of pairs of tracks so as to be longitudinally displaceable therealong;
   each of the support members in a pair being longitudinally displaced along a pair of the plurality of pairs of tracks relative to the other support member in the pair to provide a discrete spaced relation between the support members in the pair;
   a cover supported by the tray;
   the tray and the cover each have a top and a bottom;
   the tray top and the cover bottom are arranged so that the cover bottom nests in the tray top above circuit components supported by the support members; and
   the cover top is arranged so that the bottom of an other tray nests in the top of the cover, whereby a plurality of trays and covers are arranged in stacked fashion.

4. A tray arrangement as described by claim 1, including:
   at least one strap extending transversely around the plurality of trays and covers arranged in stacked fashion to provide a storable and transportable package of stacked trays and covers.

5. A tray arrangement as described by claim 2, including:
   at least one strap extending transversely around the plurality of trays and covers arranged in stacked fashion to provide a storable and transportable package of stacked trays and covers.

6. A tray arrangement as described by claim 3, including:
   at least one strap extending transversely around the plurality of trays and covers arranged in stacked fashion to provide a storable and transportable package of trays and covers.

7. A tray arrangement as described by claim 1, wherein:
   said support members are removably mounted on the pair of tracks.

8. A tray arrangement as described by claim 2, wherein:
   said support members are removably mounted on the pair of tracks so as to be interchangeably mounted thereon in pairs of the same configuration.

9. A tray arrangement as described by claim 3, wherein:
   said support members are removably mounted on the plurality of pairs of tracks so as to be interchangeably mounted thereon in pairs of the same configuration.

10. A tray arrangement as described by claim 1, wherein:
    the circuit component support members support the multiple lead circuit components whereby circuit component leads overhang the support members so as to avoid making contact therewith.

11. A tray arrangement as described by claim 2, wherein:

the circuit component support members support the multiple lead circuit components whereby circuit component leads overhang the support members so as to avoid making contact therewith.

12. A tray arrangement as described by claim 3, wherein:
the circuit component support members support the multiple lead circuit components whereby the leads thereof overhang the support members so as to avoid making contact therewith.

13. A tray arrangement as described by claim 1, wherein:
the circuit component support members support the bottoms of the multiple lead circuit components at opposite corners thereof.

14. A tray arrangement as described by claim 2, wherein:
the circuit component support members support the bottoms of the multiple lead circuit components at opposite corners thereof.

15. A tray arrangement as described by claim 3, wherein:
the circuit component support members support the bottoms of the multiple lead circuit components at opposite corners thereof.

16. A tray arrangement as described by claim 1, wherein:
the circuit component support members support the bottoms of the multiple lead circuit components at opposite sides thereof.

17. A tray arrangement as described by claim 2, wherein:
the circuit component support members support the bottoms of the multiple lead circuit components at opposite sides thereof.

18. A tray arrangement as described by claim 3, wherein:
the circuit component support members support the bottoms of the multiple lead circuit components at opposite sides thereof.

* * * * *